United States Patent
Majhi et al.

(10) Patent No.: US 9,859,278 B2
(45) Date of Patent: Jan. 2, 2018

(54) BI-AXIAL TENSILE STRAINED GE CHANNEL FOR CMOS

(71) Applicant: Intel Corporation, Santa Clara, CA (US)

(72) Inventors: Prashant Majhi, San Jose, CA (US);
Niloy Mukherjee, Portland, OR (US);
Ravi Pillarisetty, Portland, OR (US);
Willy Rachmady, Beaverton, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/037,618

(22) PCT Filed: Dec. 27, 2013

(86) PCT No.: PCT/US2013/078100
§ 371 (c)(1),
(2) Date: May 18, 2016

(87) PCT Pub. No.: WO2015/099784
PCT Pub. Date: Jul. 2, 2015

(65) Prior Publication Data
US 2016/0293601 A1 Oct. 6, 2016

(51) Int. Cl.
*H01L 29/06* (2006.01)
*H01L 29/10* (2006.01)
(Continued)

(52) U.S. Cl.
CPC .... *H01L 27/092* (2013.01); *H01L 21/823807* (2013.01); *H01L 29/0649* (2013.01);
(Continued)

(58) Field of Classification Search
CPC ............... H01L 27/092; H01L 29/0649; H01L 29/0673; H01L 29/1054; H01L 29/165;
(Continued)

(56) References Cited

U.S. PATENT DOCUMENTS 5,198,687 A * 3/1993 Baliga ................. H01L 29/7455
257/133
5,323,044 A * 6/1994 Rumennik .......... H01L 27/0629
257/154

(Continued)

FOREIGN PATENT DOCUMENTS

TW 200610005 3/2006

OTHER PUBLICATIONS

Intel Corporation, "International Preliminary Report on Patentability", PCT Application No. US2013/078100, (dated Jul. 7, 2016).
(Continued)

*Primary Examiner* — Ida M Soward
(74) *Attorney, Agent, or Firm* — Schwabe, Williamson & Wyatt P.C.

(57) ABSTRACT

An apparatus including a complimentary metal oxide semiconductor (CMOS) inverter including an n-channel metal oxide semiconductor field effect transistor (MOSFET); and a p-channel MOSFET, wherein a material of a channel in the n-channel MOSFET and a material of a channel in the p-channel MOSFET is subject to a bi-axial tensile strain. A method including forming an n-channel metal oxide semiconductor field effect transistor (MOSFET); forming a p-channel MOSFET; and connecting the gate electrodes and the drain regions of the n-channel MOSFET and the p-channel MOSFET, wherein a material of the channel in the n-channel MOSFET and a material of the channel in the p-channel MOSFET is subject to a bi-axial tensile strain.

14 Claims, 3 Drawing Sheets

(51) Int. Cl.
- *H01L 29/16* (2006.01)
- *H01L 29/78* (2006.01)
- *H01L 27/092* (2006.01)
- *H01L 21/8238* (2006.01)
- *H01L 29/165* (2006.01)
- *H01L 29/423* (2006.01)
- *H01L 29/786* (2006.01)
- *H01L 29/267* (2006.01)

(52) U.S. Cl.
CPC ...... *H01L 29/0673* (2013.01); *H01L 29/1054* (2013.01); *H01L 29/165* (2013.01); *H01L 29/42392* (2013.01); *H01L 29/78669* (2013.01); *H01L 29/78684* (2013.01); *H01L 29/267* (2013.01)

(58) Field of Classification Search
CPC ......... H01L 29/42392; H01L 29/78669; H01L 29/78684
See application file for complete search history.

(56) References Cited

U.S. PATENT DOCUMENTS

| | | | | |
|---|---|---|---|---|
| 5,943,562 A * | 8/1999 | Gardner | .......... | H01L 21/823418 257/E21.619 |
| 5,969,407 A * | 10/1999 | Gardner | ............ | H01L 21/26506 257/607 |
| 6,040,220 A * | 3/2000 | Gardner | ............ | H01L 21/28114 257/E21.205 |
| 6,407,406 B1 * | 6/2002 | Tezuka | ............... | H01L 21/02381 257/18 |
| 2004/0135138 A1 | 7/2004 | Hsu et al. | | |
| 2004/0222463 A1 * | 11/2004 | Yeo | ................. | H01L 21/76264 257/347 |
| 2005/0116360 A1 * | 6/2005 | Huang | ............ | H01L 21/823807 257/213 |
| 2005/0151134 A1 * | 7/2005 | Hsu | ................. | H01L 21/823807 257/66 |
| 2005/0285187 A1 * | 12/2005 | Bryant | ................ | H01L 29/1054 257/335 |
| 2007/0148939 A1 * | 6/2007 | Chu | ................ | H01L 21/823807 438/590 |
| 2008/0124858 A1 | 5/2008 | Nguyen et al. | | |
| 2008/0179628 A1 * | 7/2008 | Wei | ................... | H01L 21/76256 257/190 |
| 2008/0241555 A1 | 10/2008 | Clark et al. | | |
| 2009/0291540 A1 * | 11/2009 | Zhang | ............. | H01L 21/823807 438/229 |
| 2009/0309160 A1 * | 12/2009 | Cohen | ............... | H01L 21/76264 257/350 |
| 2010/0159658 A1 * | 6/2010 | Ouyang | .......... | H01L 21/823807 438/285 |
| 2010/0171181 A1 * | 7/2010 | Rhee | ................. | H01L 21/26506 257/369 |
| 2010/0244139 A1 * | 9/2010 | Bryant | ............ | H01L 21/823807 257/368 |
| 2010/0301416 A1 * | 12/2010 | Hoentschel | ..... | H01L 21/823807 257/351 |
| 2011/0049568 A1 | 3/2011 | Lochtefeld et al. | | |
| 2011/0248322 A1 | 10/2011 | Wong et al. | | |
| 2013/0260518 A1 * | 10/2013 | Buss | ............. | H01L 21/823807 438/199 |
| 2014/0011328 A1 * | 1/2014 | Bedell | ............ | H01L 21/823807 438/154 |
| 2014/0138744 A1 * | 5/2014 | Kotlyar | ................. | H01L 29/785 257/192 |
| 2014/0239345 A1 * | 8/2014 | Boyanov | ................. | H01L 29/78 257/190 |
| 2014/0246696 A1 * | 9/2014 | Flachowsky | ........ | H01L 29/7848 257/190 |
| 2014/0273368 A1 * | 9/2014 | Hung | ................ | H01L 29/66553 438/230 |

OTHER PUBLICATIONS

Intel Corporation, "Rejection", TW Application No. 103141008, (dated Jul. 28, 2016).
Intel Corporation, et al., "International Search Report and the Written Opinion", PCT/US2013/078100, (dated Aug. 22, 2014).
Intel Corporation, "Office Action", TW App No. 103141008, (dated Feb. 17, 2016).
Intel Corporation, "Office Action", TW Application No. 103141008, (dated Apr. 17, 2017).

\* cited by examiner

BI-AXIAL TENSILE STRAINED GE CHANNEL FOR CMOS

CROSS-REFERENCE TO RELATED APPLICATION

This patent application is a U.S. National Phase Application under 35 U.S.C. §371 of International Application No. PCT/US2013/078100, filed Dec. 27, 2013, entitled BI-AXIAL TENSILE STRAINED GE CHANNEL FOR CMOS.

FIELD

Semiconductor Devices

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Increase carrier mobility (beyond a carrier mobility of silicon) is desired to continue scaling transistor devices, including complementary metal oxide semiconductor (CMOS) inverters and to deliver increased performance and lower power. Promising materials such as group III-V compound semiconductor materials offer high electron mobility for n-channel metal oxide semiconductor field effect transistors (MOSFETs) and germanium based materials offer high hole mobility for p-channel MOSFETs. Because of differences between group III-V compound semiconductor materials and germanium materials, there are significant challenges integrating the two separate systems on silicon in a highly scaled CMOS inverters for sub-10 nanometers (nm) node geometries. Additionally, thin film stacks including buffer layers, gate stacks, contacts, etc. are expected to be different for group III-V compound semiconductors and germanium which further increases a complexity of integrating these different channel materials for scaled CMOS.

DETAILED DESCRIPTION

Semiconductor devices and methods of forming and using semiconductor devices are described. Also described is the co-integration of n-channel MOSFET and p-channel MOSFET devices for CMOS implementation (a CMOS inverter) wherein each transistor device includes a channel material subject to a bi-axial tensile strain. In one embodiment, an n-channel MOSFET and a p-channel MOSFET are formed of a common channel material that is subject to a bi-axial tensile strain. In one embodiment, that common material is a germanium material.

Figure 1:
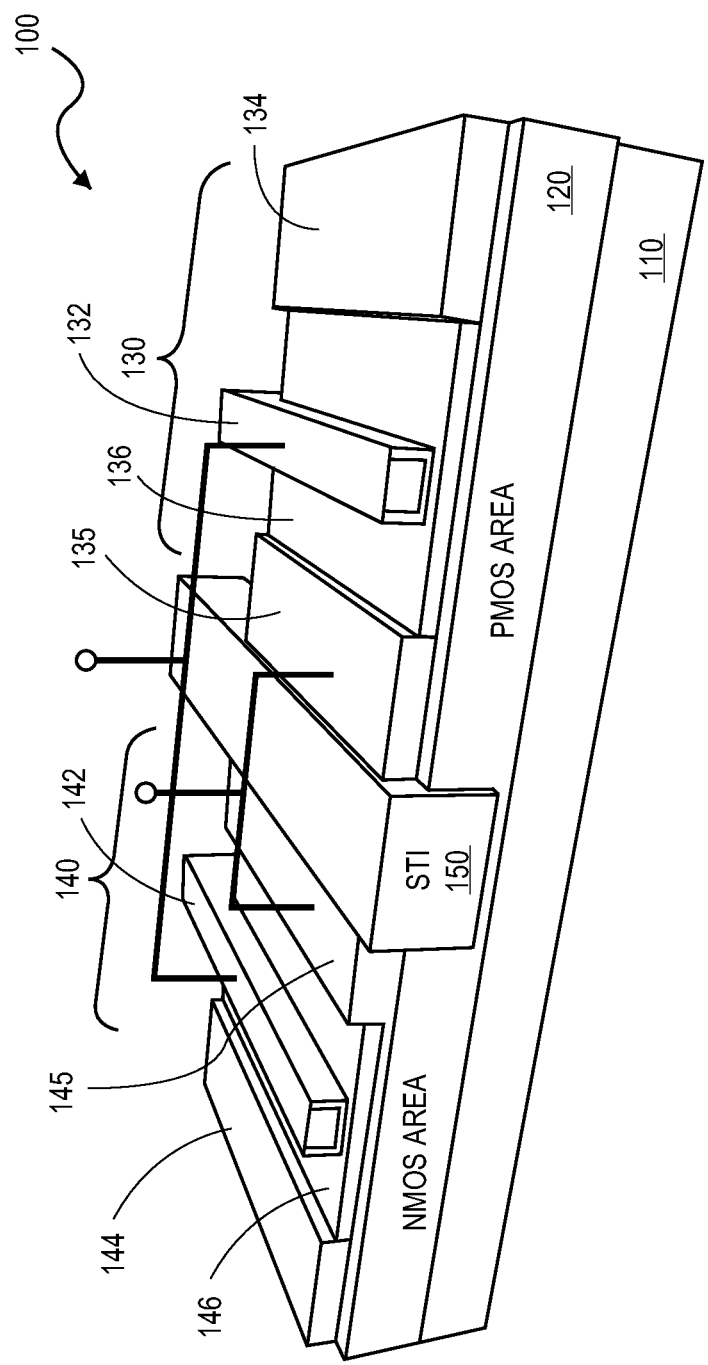
FIG. 1 shows a top, side perspective view of an embodiment of a CMOS inverter.

FIG. 1 shows a top, side perspective view of a CMOS inverter. Inverter 100 includes, in this embodiment, p-channel MOSFET 130 and n-channel MOSFET 140. Each of p-channel MOSFET 130 and n-channel MOSFET 140 is, in this embodiment, a planar device. In the embodiment illustrated in FIG. 1, each of p-channel MOSFET 130 and n-channel MOSFET 140 is formed on substrate 110. Substrate 110 is, for example, a single crystal silicon substrate or a silicon on insulator (SOI) substrate. Overlying silicon substrate 110 is buffer layer 120. P-channel MOSFET 130 and n-channel MOSFET 140 are respectively formed on buffer layer 120 and separated by shallow trench isolation (STI) structure 150 of, for example, a dielectric material such as an oxide. P-channel MOSFET 130 includes gate electrode 132, source region 134, drain region 135 and channel 136 disposed between source region 134 and drain region 135 below gate electrode 132. Gate electrode 132 is separated from channel 136 by a gate dielectric disposed therebetween such as a dielectric material having a dielectric constant greater than silicon dioxide (a high K material). N-channel MOSFET 140 includes gate electrode 142, source region 144, drain region 145 and channel 146 disposed between source region 144 and drain region 145. Gate electrode 142 is separated from channel region by a gate dielectric disposed therebetween of, for example, a high K dielectric material. P-channel MOSFET 130 includes gate electrode 132, source region 134 and drain region 135 appropriately doped or constituting p-type material. N-channel MOSFET 140 includes gate electrode 142, source region 144 and drain region 145 appropriately doped or constituting n-type material. CMOS inverter 100 is formed by the connection of drain region 135 of p-channel MOSFET 130 to drain region 145 of n-channel MOSFET 140 and the connection of each gate electrode as illustrated.

In one embodiment, buffer layer 120 is selected of a material that has a larger lattice constant than a lattice constant of a material for channel 136 of p-channel MOSFET 130 and channel 146 of n-channel MOSFET 140. As illustrated, channel 136 and channel 146 are disposed on buffer layer 120. A difference in lattice constants between the materials will produce a bi-axial tensile strain in each of channel 136 and channel 146. In one embodiment, a material for channel region 136 and a material for channel 146 is common. A representative common material for these channels is germanium. A bi-axial tensile strain in germanium modifies its band structure and carrier effective mass (mobility) for both electrons and holes. In one embodiment, a material for buffer layer 120 that has a larger lattice constant than germanium is a group III-V compound semiconductor material such as indium gallium phosphide (InGaP). In one embodiment, a bi-axial tensile strain level is greater than 1.5 percent.

One technique for forming a CMOS inverter such as inverter 100 is to epitaxially or otherwise deposit buffer layer 120 on substrate 110. It is appreciated that a desired material for buffer layer 120 to impart a bi-axial tensile strain of at least 1.5; percent on germanium may similarly impart a strain on substrate 110. To reduce or inhibit any strain on substrate 110, a graded buffer layer may be used, such as a graded Group III-V compound semiconductor (e.g., InGaP) that has its largest lattice constant at the channel interface.

After forming buffer layer 120, channel 136 and channel 236 and the junction regions (source region 134 and drain region 135 and source region 234 and drain region 235) may be formed such as by expitaxial deposition. A gate dielectric and gate electrode may then be introduced for each device (gate electrode 132, gate electrode 232) and the individual devices doped as desired. Contacts between the drain regions and the electrodes are made to form a CMOS inverter.

Figure 2:
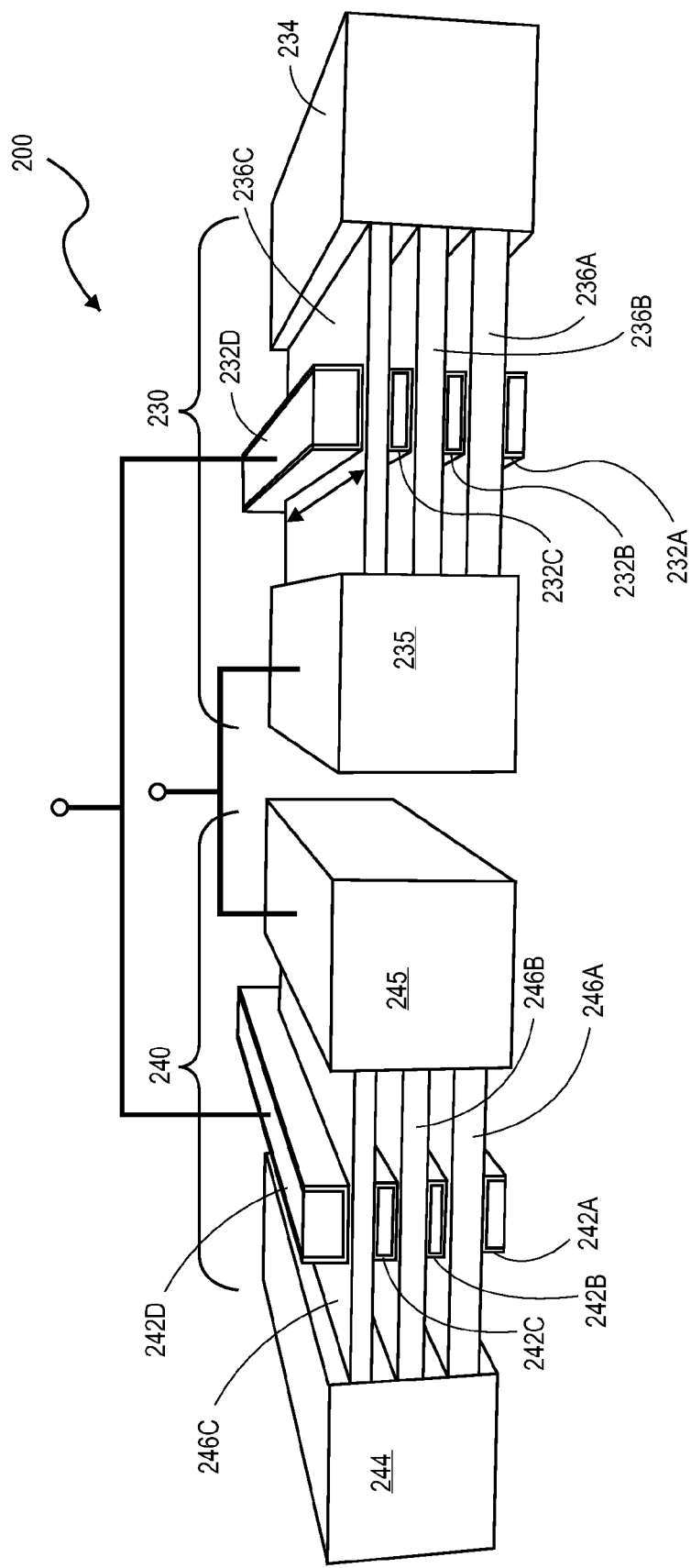
FIG. 2 shows another embodiment of a CMOS inverter.

FIG. 2 shows another embodiment of an integrated p-channel and an n-channel MOSFET in, for example, a CMOS inverter. In this embodiment, the p-channel MOSFET and the n-channel MOSFET each are non-planar devices, in particular, nanowire or nanoribbon devices. Referring to FIG. 2, inverter 200 includes n-channel MOSFET structure 230 including gate electrode portions 232A, 232B, 232C and 232D; source region 234; drain region 235; and channels 236A, 236B and 236C disposed, respectively, between the gate electrode. CMOS inverter 200 also includes n-channel MOSFET structure 240 including gate electrode portions 242A, 242B, 242C and 242D; source region 244; drain region 245; and channels 246A, 246B and 246C disposed between respective ones of the gate electrode portion. For p-channel MOSFET structure 230, each of gate electrode portions 232A-232D is separated from a respective channel (channels 236A-236C) by a gate dielectric material such as a high K dielectric and the gate electrodes and source and drain regions are doped or constitute a p-type. Similarly, gate electrode portions 242A-242D of n-channel MOSFET 240 are separated from respective ones of channels 246A-246C by a gate dielectric material, such as a high dielectric constant material and the gate electrode portions and source and drain regions are doped or constitute an n-type. A CMOS inverter is illustrated by the connection of drain region 235 of p-channel MOSFET structure 230 to drain region 245 of n-channel MOSFET structure 240 and the connection of the gate electrodes of the structures.

In one embodiment, a material for channels 236A-236C of p-channel MOSFET structure 230 and channels 246A-246C of n-channel MOSFET structure 240 are each subject to a bi-axial tensile strain. In one embodiment, a material for such channels for both p-channel MOSFET structure 230 and n-channel MOSFET structure 240 is common or the same. A representative material is germanium. In one embodiment, a bi-axial tensile strain is imparted on the channels by the gate electrode portions. Representative materials for the gate electrodes include titanium nitride (TiN) and tantalum nitride (TaN). For channels formed of a nanoribbon configuration such as shown in FIG. 2, in one embodiment, the nanoribbon channels have a thickness on the order of 15 nanometers or less. In order to impart a bi-axial tensile strain on the nanoribbon channels, in one embodiment, the gate electrode portions have a length greater than 100 nanometers. In another embodiment, the source and drain regions serve as anchors to retain the strain in the channels. A material for source and drain regions (source region 234, drain region 235, source region 244, drain region 245) and/or any spacer material disposed between the gate electrode portions and the source and drain regions imparts strain or serves to retain the strain.

The structure of FIG. 2 may be formed in a variety of ways. One technique is to pattern the nanoribbon/nanowire channels 236A-236C and 246A-246C as alternating epitaxial layers of germanium between layers of a sacrificial material such as silicon. The sacrificial layers may then removed to leave the nanoribbons (236A-236C or 246A-246C) suspended in different planes between supports on and over the substrate. At this point, the source and drain regions may be formed such as by appropriately doping the supports for the suspended nanowires. A dielectric material, such as a high K dielectric material may then be introduced around each of the nanowires followed by the introduction of a gate electrode material. In one embodiment, a sacrificial gate electrode may be introduced and patterned and then replaced with a desired gate electrode material. Spacers may also be added between the nanoribbon channels and the source and drain regions. To form a CMOS inverter, contacts may be made and connected between the drains of a p-channel MOSFET and an n-channel MOSFET and between the gates of the devices.

The above description referenced two structural embodiments for a CMOS inverter. It is appreciated that the particular structural embodiment need not be limited in the sense that a variety of different structural embodiments may be fabricated in which a bi-axial tensile strain is imparted on each of a channel of a p-channel MOSFET and a channel of an n-channel MOSFET of a CMOS inverter and each of the channels has a common material (e.g., germanium). Accordingly, other structural embodiments such as multi-gate devices and multi-bridge channel devices are contemplated.

Figure 3:
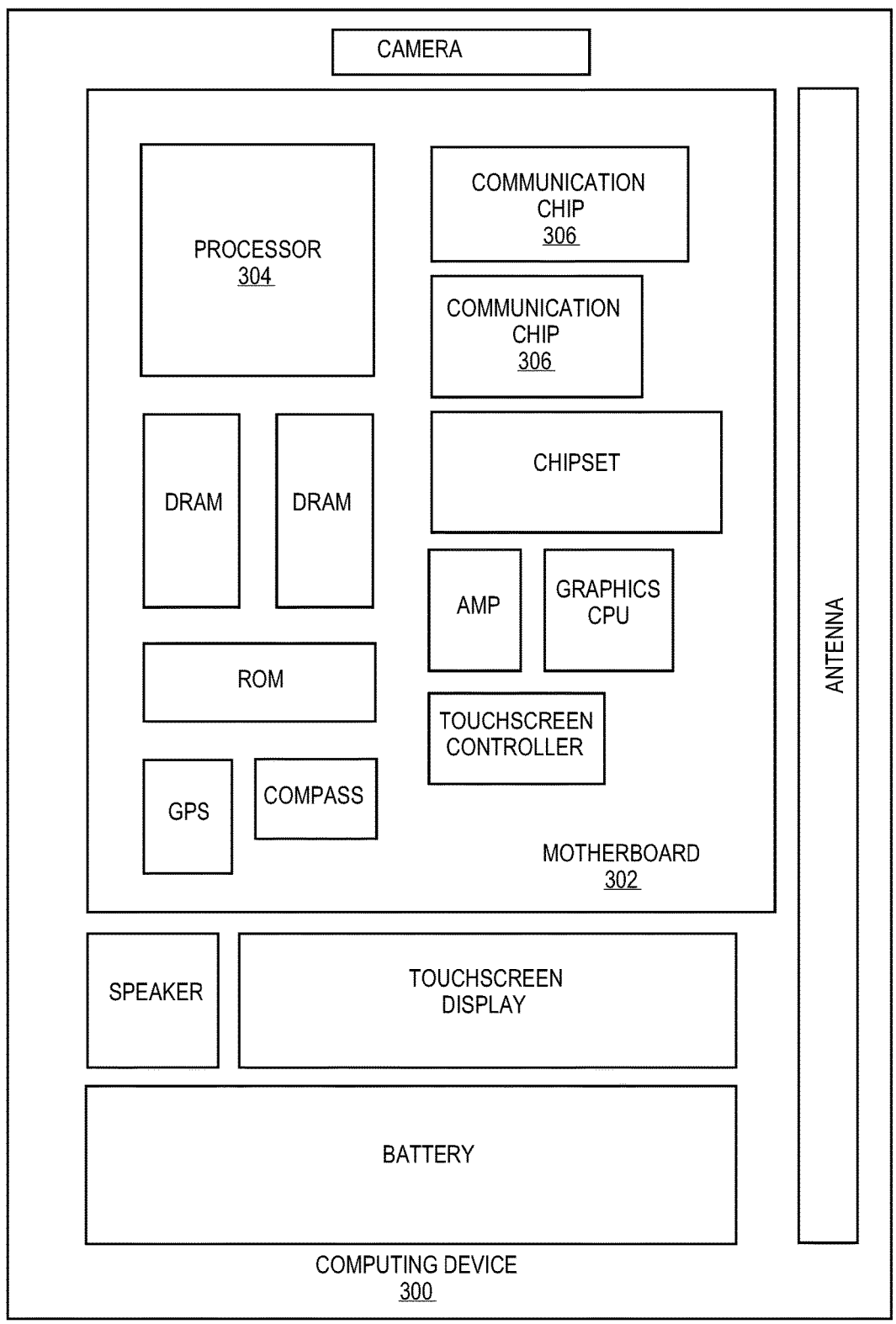
FIG. 3 illustrates computing device in accordance with one implementation.

FIG. 3 illustrates computing device 300 in accordance with one implementation. Computing device 300 houses board 302. Board 302 may include a number of components, including but not limited to processor 304 and at least one communication chip 306. Processor 304 is physically and electrically coupled to board 302. In some implementations at least one communication chip 306 is also physically and electrically coupled to board 302. In further implementations, communication chip 306 is part of processor 304.

Depending on its applications, computing device 300 may include other components that may or may not be physically and electrically coupled to board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 306. For instance, first communication chip 306 may be dedicated to shorter range wireless communications such as Wi-Fi and Bluetooth and second communication chip 306 may be dedicated to longer range wireless communications such as GPS, EDGE, GPRS, CDMA, WiMAX, LTE, Ev-DO, and others.

Processor 304 of computing device 300 includes an integrated circuit die packaged within processor 304. In some implementations of the invention, the integrated circuit die of the processor includes one or more devices, such as one or more CMOS inverters of bi-axial tensile strained transistor devices of, for example, a common material (e.g., germanium) as described above. The term "processor" may refer to any device or portion of a device that processes electronic data from registers and/or memory to transform that electronic data into other electronic data that may be stored in registers and/or memory.

Communication chip 306 also includes an integrated circuit die packaged within communication chip 306. In accordance with another implementation, the integrated circuit die of the communication chip includes one or more devices, such as CMOS inverters, that are formed in accordance with implementations described above.

In further implementations, another component housed within computing device 300 may contain an integrated circuit die that includes one or more devices, such as CMOS inverters that are formed in accordance with implementations.

In various implementations, computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 300 may be any other electronic device that processes data.

EXAMPLES

The following examples pertain to embodiments.

Example 1 is an apparatus including a complimentary metal oxide semiconductor (CMOS) inverter comprising an n-channel metal oxide semiconductor field effect transistor (MOSFET) and a p-channel MOSFET, wherein a material of a channel in the n-channel MOSFET and a material of a channel in the p-channel MOSFET is each subject to a bi-axial tensile strain.

In Example 2, the material of the channel in the n-channel MOSFET and the material of the channel in the p-channel MOSFET of the apparatus of Example 1 are the same.

In Example 3, the material of the channel in the n-channel MOSFET and the material of the channel in the p-channel MOSFET of the apparatus of Example 1 are each germanium.

In Example 4, the channel of each of the n-channel MOSFET and the p-channel MOSFET of the apparatus of Example 1 are disposed on a buffer layer and the buffer layer includes a material having a larger lattice constant than a lattice constant of a material of the channel in the n-channel MOSFET and a material of the channel in the p-channel MOSFET.

In Example 5, the material for the buffer layer of the apparatus of Example 4 includes a Group III-V compound semiconductor material.

In Example 6, the n-channel MOSFET and the p-channel MOSFET of the apparatus of Example 4 are planar transistors.

In Example 7, the material of the channel in the n-channel MOSFET and the material of the channel in the p-channel MOSFET of the apparatus of Example 1 each has a lattice constant that is less than a lattice constant of a material for the respective gate electrode.

In Example 8, the respective gate electrode of the apparatus of Example 7 has a length greater than 100 nanometers.

Example 9 is an apparatus including an n-channel metal oxide semiconductor field effect transistor (MOSFET) including a gate electrode, a source region, a drain region and a channel; and a p-channel MOSFET including a gate electrode, a source region, a drain region and a channel, wherein the gate electrode of the n-channel MOSFET is coupled to the gate electrode of the p-channel MOSFET and the drain of the n-channel MOSFET is coupled to the drain of the p-channel MOSFET, and wherein a material of the channel in the n-channel MOSFET and a material of the channel in the p-channel MOSFET is common and subject to a bi-axial tensile strain.

In Example 10, the common material of the channel in the n-channel MOSFET and a material of the channel in the p-channel MOSFET in the apparatus of Example 9 is germanium.

In Example 11, the channel of each of the n-channel MOSFET and the p-channel MOSFET in the apparatus of Example 9 is disposed on a buffer layer and the buffer layer comprises a material having a larger lattice constant than a lattice constant of the common material of the channel in the n-channel MOSFET and a material of the channel in the p-channel MOSFET.

In Example 12, a material for the buffer layer in the apparatus of Example 11 includes a Group III-V compound semiconductor material.

In Example 13, the n-channel MOSFET and the p-channel MOSFET of the apparatus of Example 11 are planar transistors.

In Example 14, the common material of the channel in the n-channel MOSFET and a material of the channel in the p-channel MOSFET in the apparatus of Example 9 has a lattice constant that is less than a lattice constant of a material for the respective gate electrode.

In Example 15, the gate electrode in the apparatus of Example 14 has a length greater than 100 nanometers.

In Example 16, the channel of the n-channel MOSFET and the channel of the p-channel MOSFET in the apparatus of Example 14 includes a nanoribbon.

Example 17 is a method including forming an n-channel metal oxide semiconductor field effect transistor (MOSFET); forming a p-channel MOSFET; and connecting gate electrodes and drain regions of the n-channel MOSFET and the p-channel MOSFET, wherein a material of a channel in the n-channel MOSFET and a material of a channel in the p-channel MOSFET is subject to a bi-axial tensile strain.

In Example 18, the material of the channel in the n-channel MOSFET and the material of the channel in the p-channel MOSFET in the apparatus of Example 17 is common.

In Example 19, the method of Example 17 further includes forming a buffer layer on the substrate, the buffer layer disposed adjacent the channel of the n-channel MOSFET and the channel of the p-channel MOSFET, the buffer layer having a lattice constant greater than a lattice constant of the common material of the channel in the n-channel MOSFET and the material of the channel in the p-channel MOSFET.

In Example 20, the common material of the channel in the n-channel MOSFET and the material of the channel in the p-channel MOSFET in the method of Example 17 is germanium.

In Example 21, the common material of the channel in the n-channel MOSFET and the channel in the p-channel MOS- FET in the method of Example 17 each has a lattice constant that is less than a lattice constant of a material for the respective gate electrode.

In Example 22, the respective gate electrode in the method of Example 21 has a length greater than 100 nanometers.

In Example 23, the channel of the n-channel MOSFET and the channel of the p-channel MOSFET in the method of Example 21 include a nanoribbon.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. An apparatus comprising:
    a complimentary metal oxide semiconductor (CMOS) inverter comprising an n-channel metal oxide semiconductor field effect transistor (MOSFET) and a p-channel MOSFET,
    wherein a material of a channel in the n-channel MOSFET and a material of a channel in the p-channel MOSFET is each subject to a bi-axial tensile strain, and
    wherein the channel of each of the n-channel MOSFET and the p-channel MOSFET are disposed on a buffer layer and the buffer layer comprises a material having a larger lattice constant than a lattice constant of a material of the channel in the n-channel MOSFET and a material of the channel in the p-channel MOSFET.

2. The apparatus of claim 1, wherein the material of the channel in the n-channel MOSFET and the material of the channel in the p-channel MOSFET are the same.

3. The apparatus of claim 1, wherein the material of the channel in the n-channel MOSFET and the material of the channel in the p-channel MOSFET are each germanium.

4. The apparatus of claim 1, wherein a material for the buffer layer comprises a Group III-V compound semiconductor material.

5. The apparatus of claim 1, wherein the n-channel MOSFET and the p-channel MOSFET are planar transistors.

6. The apparatus of claim 1, wherein the material of the channel in the n-channel MOSFET and the material of the channel in the p-channel MOSFET each has a lattice constant that is less than a lattice constant of a material for a respective gate electrode.

7. The apparatus of claim 6, wherein the respective gate electrode has a length greater than 100 nanometers.

8. An apparatus comprising:
    an n-channel metal oxide semiconductor field effect transistor (MOSFET) comprising a gate electrode, a source region, a drain region and a channel; and
    a p-channel MOSFET comprising a gate electrode, a source region, a drain region and a channel,
    wherein the gate electrode of the n-channel MOSFET is coupled to the gate electrode of the p-channel MOSFET and the drain of the n-channel MOSFET is coupled to the drain of the p-channel MOSFET,
    wherein a material of the channel in the n-channel MOSFET and a material of the channel in the p-channel MOSFET is common and subject to a bi-axial tensile strain, and
    wherein the channel of each of the n-channel MOSFET and the p-channel MOSFET is disposed on a buffer layer and the buffer layer comprises a material having a larger lattice constant than a lattice constant of the material of the channel in the n-channel MOSFET and a material of the channel in the p-channel MOSFET.

9. The apparatus of claim 8, wherein a material for the buffer layer comprises a Group III-V compound semiconductor material.

10. The apparatus of claim 8, wherein the n-channel MOSFET and the p-channel MOSFET are planar transistors.

11. The apparatus of claim 8, wherein the common material of the channel in the n-channel MOSFET and a material of the channel in the p-channel MOSFET has a lattice constant that is less than a lattice constant of a material for the respective gate electrode.

12. The apparatus of claim 11, wherein the gate electrode has a length greater than 100 nanometers.

13. The apparatus of claim 11, wherein each of the channel of the n-channel MOSFET and the channel of the p-channel MOSFET comprises a nanoribbon.

14. An apparatus comprising:
    an n-channel metal oxide semiconductor field effect transistor (MOSFET) comprising a gate electrode, a source region, a drain region and a channel; and
    a p-channel MOSFET comprising a gate electrode, a source region, a drain region and a channel,
    wherein the gate electrode of the n-channel MOSFET is coupled to the gate electrode of the p-channel MOSFET and the drain of the n-channel MOSFET is coupled to the drain of the p-channel MOSFET,
    wherein a material of the channel in the n-channel MOSFET and a material of the channel in the p-channel MOSFET is subject to a bi-axial tensile strain, and
    wherein the material of the channel in the n-channel MOSFET and the material of the channel in the p-channel MOSFET that is common is germanium.

* * * * *